(12) United States Patent
Itakura et al.

(10) Patent No.: US 8,533,570 B2
(45) Date of Patent: Sep. 10, 2013

(54) MAGNETIC RECORDING APPARATUS

(75) Inventors: Akihiro Itakura, Akishima (JP);
Masatoshi Sakurai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 13/209,184

(22) Filed: Aug. 12, 2011

(65) Prior Publication Data

US 2012/0060073 A1 Mar. 8, 2012

(30) Foreign Application Priority Data

Sep. 8, 2010 (JP) ................. 2010-201410

(51) Int. Cl.
*G11C 29/00* (2006.01)
(52) U.S. Cl.
USPC .................. 714/770; 714/758; 714/772
(58) Field of Classification Search
USPC ................... 714/770, 758, 772, 712
See application file for complete search history.

(56) References Cited

U.S. PATENT DOCUMENTS

| | | | | |
|---|---|---|---|---|
| 5,740,306 | A * | 4/1998 | Shinohara et al. | 386/334 |
| 7,982,994 | B1 * | 7/2011 | Erden et al. | 360/55 |
| 2003/0126158 | A1 * | 7/2003 | Chainer et al. | 707/200 |
| 2008/0218893 | A1 * | 9/2008 | Kubota | 360/71 |
| 2009/0080169 | A1 * | 3/2009 | Webster et al. | 361/772 |

FOREIGN PATENT DOCUMENTS

| | | |
|---|---|---|
| JP | 9-138987 | 5/1997 |
| JP | 2002-109712 | 4/2002 |
| JP | 2002-279735 | 9/2002 |
| JP | 2003-151103 | 5/2003 |
| JP | 2007-073116 | 3/2007 |
| JP | 2007-265568 | 10/2007 |
| JP | 2007-305289 | 11/2007 |
| JP | 2009-266320 | 11/2009 |
| JP | 2011-192339 | 9/2011 |

OTHER PUBLICATIONS

Japanese Application No. 2010-201410 Office Action (Dec. 20, 2011) (English translation attached).

\* cited by examiner

*Primary Examiner* — Fritz Alphonse
(74) *Attorney, Agent, or Firm* — Patterson & Sheridan LLP

(57) ABSTRACT

According to one embodiment, there is provided a magnetic recording apparatus configured to record data subjected to error correcting coding according to a shingled recording scheme, the magnetic recording apparatus including a magnetic recording medium in which unit bits of the data subjected to error correcting coding are recorded with phase shifted between adjacent tracks, a read head having a width covering a plurality of tracks and configured to read data from the plurality of tracks, and a recording controller configured to record the data subjected to error correcting coding and a parity for the data in the plurality of tracks covered by the read head, in a divided manner.

6 Claims, 7 Drawing Sheets

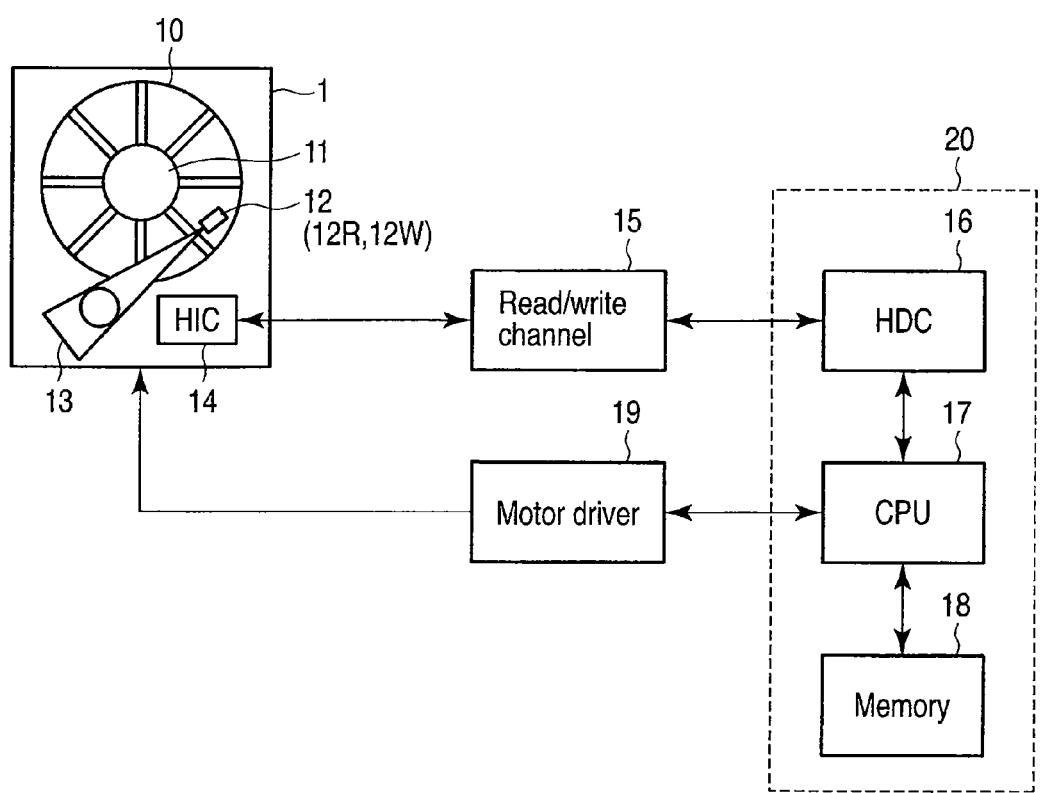
F I G. 1

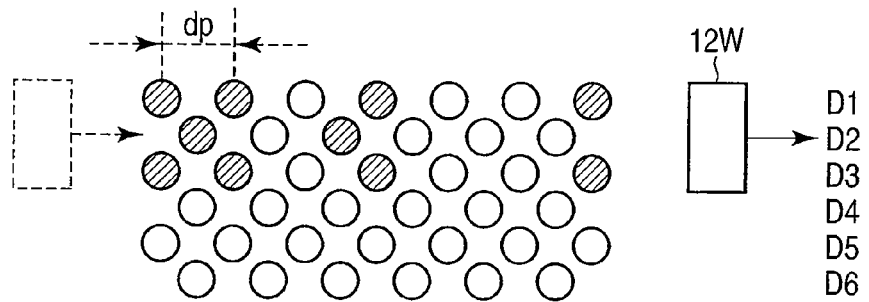
F I G. 2A
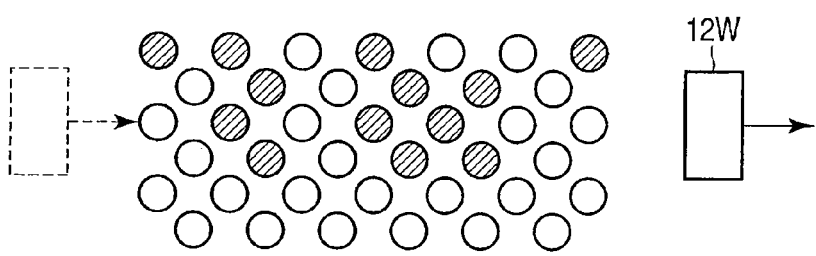
F I G. 2B
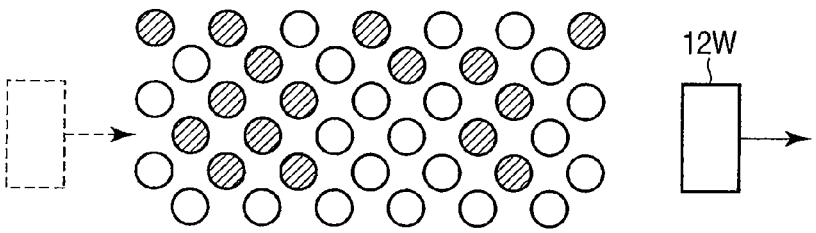
F I G. 2C
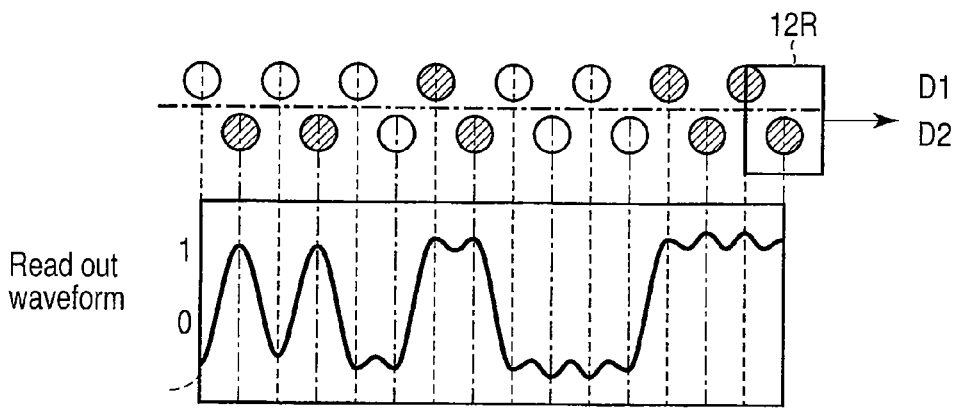
F I G. 3

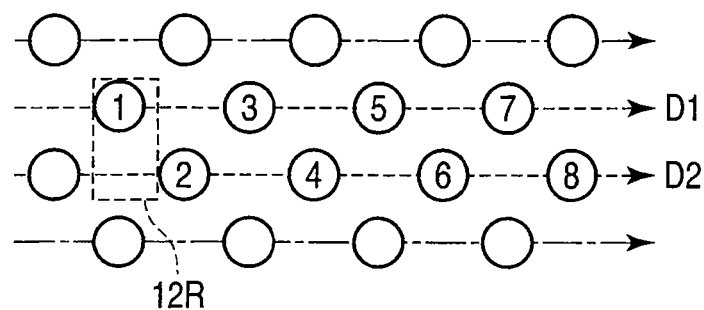
F I G. 6
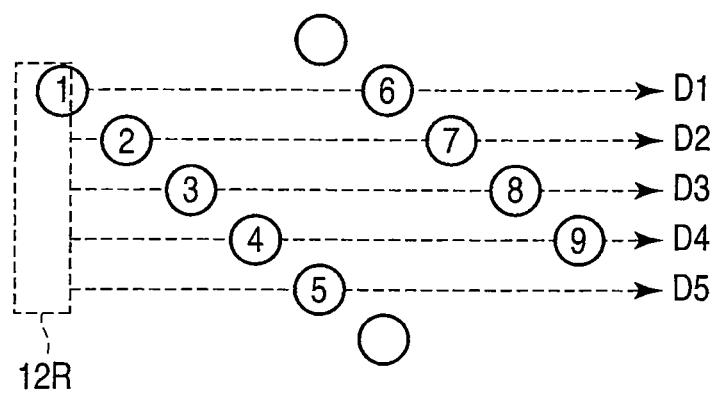
F I G. 7
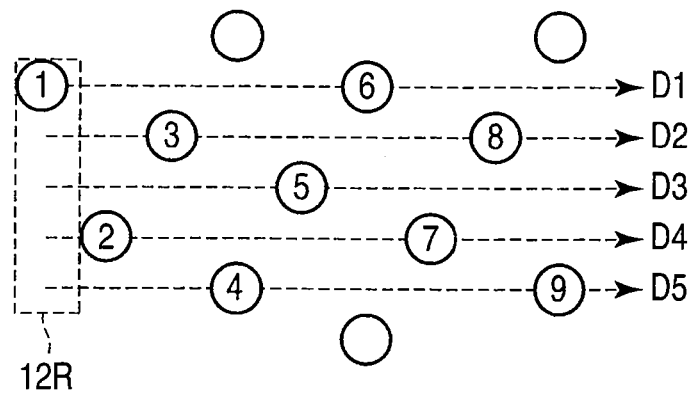
F I G. 8

MAGNETIC RECORDING APPARATUS

CROSS-REFERENCE TO RELATED APPLICATIONS

This application is based upon and claims the benefit of priority from Japanese Patent Application No. 2010-201410, filed Sep. 8, 2010; the entire contents of which are incorporated herein by reference.

FIELD

Embodiments described herein relate generally to a magnetic recording apparatus such as a hard disk apparatus.

BACKGROUND

In recent years, with increased multifunctionality and operation speeds of information apparatuses such as personal computers and hard disk recorders, the amount of information handled by users has been increasing. Thus, the density with which an information recording apparatus records data to a recording medium has been desired to be increased. Increase in recording density requires miniaturization of a recording cell or mark that is a write unit for recording in the recording medium. However, for conventional recording media, miniaturization of recording cells or marks is confronted with serious challenges.

In recording media for current hard disk apparatuses, a granular thin film of thickness several tens of nanometers is deposited on a disk substrate. When grains in the granular thin film are miniaturized in order to increase the recording density, thermal fluctuation, i.e., a phenomenon in which a decrease in the volume of magnetic grains reduces the ratio of magnetic energy to thermal energy causing recording magnetization to change or disappear under the effect of temperature, occurs to make recording unstable in small polycrystals. Thus, although no problem occurs when the recording cells are large, recording may be unstable or noise increases when the recording cells are small. This is because the smaller recording cell contains a reduced number of crystal grains and contributes to relative increase in the level of the interaction between recording cells.

To avoid this problem, a bit pattered medium (BPM), which may be simply referred to as a patterned medium, has been proposed as a next-generation magnetic recording medium that replaces the thin film medium; in the bit patterned medium, a recording material is separated by a non-recording material in advance, and read and write are carried out using a single dot of recording material as a single recording cell.

The bit pattered medium includes a magnetic dot array with nanometer scale magnetic dots regularly arrayed on a substrate. A digital signal of "0" or "1", where one dot corresponds to one bit, is recorded in the bit patterned medium depending on the direction of magnetization in each of the magnetic dots. In the bit patterned medium, the bits are physically completely isolated from one another. This in principle prevents possible noise resulting from magnetic transition, which is a major factor that hinders increase in the recording density of a continuous film medium.

However, the following problem is posed by the patterned medium in which the recording material is separated by the non-recording material on the surface of the recording medium. That is, a recording head needs to write data to each of the separated recording cells when recording the data in the recording medium at a particular position. Thus, adjusting timing when the recording head starts recording is important. If the recording is started at the wrong timing, the recording head may perform a write operation on the non-recording material or on the adjacent recording cells. This may result in an increase in the number of write errors.

In the bit patterned medium, the dots are arrayed in a square lattice pattern or a staggered pattern.

In the lattice pattern, in which the dots are aligned with one another lengthwise and crosswise, read and write are carried out using one dot row as one track. Thus, precise restrictive conditions are required for conditions in the cross track direction such as a head core width, tracking, and the like.

On the other hand, in the staggered pattern, which includes a large number of dot rows arranged at a given dot pitch, an odd numbered dot row is out of phase with a corresponding even numbered dot row by 180 degrees. When a head with a width covering two adjacent dot rows is utilized to carry out read and write using two dot rows as one data track, for example, the conditions in the cross track direction such as the head core width, tracking, and the like are relieved. However, if recording is carried out on the staggered pattern using two dot rows as one data track, a write phase margin decreases.

Thus, to increase the write phase margin, what is called shingled recording may be carried out in which the head records data in one dot row while moving in the cross track direction. However, a block configuration for error correcting codes (ECCs) is not taken into account in the shingled recording. Thus, the shingled recording has room for improvement in terms of efficient error correction and a data transfer rate.

Additionally, the shingled recording is applied not only to bit patterned media but also to continuous film media. Hence, the block configuration for the error correcting codes in the shingled recording needs to be taken into account for continuous film media.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is a block diagram showing a magnetic recording apparatus according to an embodiment;

FIGS. 2A, 2B and 2C are diagrams illustrating an example of shingled recording according to the embodiment;

FIG. 3 is a diagram illustrating a readout method from the medium illustrated in FIG. 2;

FIG. 6 is a diagram illustrating an example in which data subjected to error correcting coding is recorded in two dot rows in a divided manner according to Example 1;

FIG. 7 is a diagram illustrating an example in which data subjected to error correcting coding is recorded in five dot rows in a divided manner according to Example 1;

FIG. 8 is a diagram illustrating another example in which data subjected to error correcting coding is recorded in five dot rows in a divided manner according to Example 1;

DETAILED DESCRIPTION

Figure 4A:
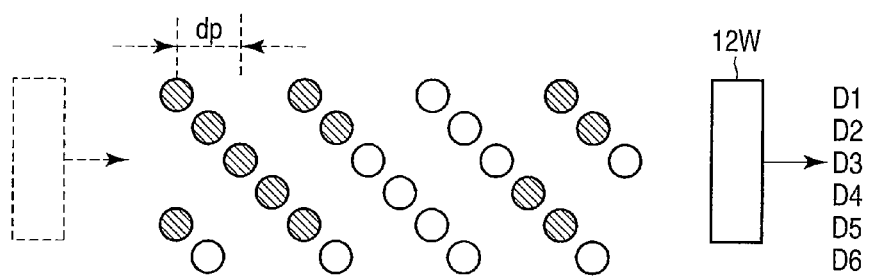
FIGS. 4A, 4B and 4C are diagrams illustrating another example of shingled recording according to the embodiment.

Various embodiments will be described hereinafter with reference to the accompanying drawings.

In general, according to one embodiment, there is provided a magnetic recording apparatus configured to record data subjected to error correcting coding according to a shingled recording scheme, the magnetic recording apparatus including a magnetic recording medium in which unit bits of the data subjected to error correcting coding are recorded with phase shifted between adjacent tracks, a read head having a width covering a plurality of tracks and configured to read data from the plurality of tracks, and a recording controller configured to record the data subjected to error correcting coding and a parity for the data in the plurality of tracks covered by the read head, in a divided manner.

FIG. 1 is a block diagram illustrating the configuration of a magnetic recording apparatus according to the embodiment.

A disk drive 1 includes a disk 10 that is a magnetic recording medium, a spindle motor (SPM) 11 configured to rotate the disk 10, a head 12, an actuator 13, and a head amplifier unit (head IC) 14. The disk 10 may be a bit patterned medium or a continuous film medium. The bit patterned medium includes a magnetic dot array with nanometer-scale magnetic dots regularly arrayed on a substrate. A digital signal of "0" or "1", where one dot corresponds to one bit, is recorded in the bit patterned medium depending on the direction of magnetization in each of the magnetic dots.

The head 12 is configured such that a read head 12R and a write head 12W are separately mounted on one slider. The read head 12R reads data recorded in the disk 10. The write head 12W writes data to the disk 10. The actuator 13 comprises a suspension with the head 12 mounted thereon, an arm, and a voice coil motor (VCM). The actuator 13 moves the head 12 in a radial direction, i.e., cross track direction, on the disk 10 for tracking control.

The head amplifier unit 14 includes a read amplifier configured to amplify a read signal read by the read head 12R in the head 12 to output the amplified read signal to a read/write channel 15. Furthermore, the head amplifier unit 14 converts write data output by the read/write channel 15 into a write signal or a write current. The head amplifier unit 14 then supplies the write signal to the write head 12W of the head 12.

The disk drive 1 comprises the read/write channel 15, a hard disk controller (HDC) 16, a microprocessor (CPU) 17, a memory 18, and a motor driver 19 all of which are mounted on a print circuit board. HDC 16, CPU 17, and the memory 18 are mounted on a one-chip integrated circuit 20. These members function as a recording controller.

The read/write channel 15 is a signal processing unit configured to process read/write data signals. HDC 16 forms an interface between the disk drive 1 and a host system such as a personal computer or digital apparatus (not shown in the drawings) and controls data transfer and read/write operations. CPU 17 is a main controller for the disk drive 1, and controls head positioning (servo control) and rearranges read/write data. The memory 18 is a flash EEPROM.

The motor driver 19 comprises an SPM driver configured to supply a driving current to SPM 11 and a VCM driver configured to supply a driving current to VCM in the actuator 13. The VCM driver supplies the driving current to VCM in the actuator 13 in accordance with head positioning control (servo control) performed by CPU 17. The VCM driver thus controllably moves the head 12 in the radial direction on the disk 10.

FIGS. 2A, 2B and 2C illustrate an example of a bit patterned medium. With reference to FIGS. 2A, 2B and 2C, shingled recording carried out on the bit patterned medium will be described below. In the bit patterned medium illustrated in FIGS. 2A, 2B and 2C, magnetic dots are arrayed in a staggered pattern. An odd numbered dot row is out of phase with a corresponding even numbered dot row by 180 degrees. That is, each of the dots in an even numbered dot row is positioned between corresponding two dots in a corresponding odd numbered dot row. The direction of array of the dots corresponds to a track direction, i.e., the circumferential direction of the disk. In FIGS. 2A to 2C, one dot row forms one track.

The write head 12W has a width covering a plurality of dot rows, for example, three rows. Write data output by the read/write channel 15 is converted into a write signal or write current by the head amplifier unit 14. The resultant signal is supplied to the write head 12W. Each bit of the write data is written to the corresponding dot.

FIG. 2A illustrates a write operation to the first dot row D1. During the write operation to the first dot row D1, the actuator 13 performs tracking control such that an edge of the write head 12W in the cross track direction covers the first dot row D1. Carrying out the write operation utilizing the edge of the write head 12W as described above is also referred to as edge write. Black circles are assumed to indicate "1". White circles are assumed to indicate "0". Then, 1101001 ... are written to the first dot row. At this time, the same data are also written to the second dot row D2 and the third dot row D3 because the write head 12W has such a width that can access three dot rows simultaneously. However, the present example adopts shingled recording in which recording is carried out on one dot row at a time such that after data are recorded in one dot row, the write head is moved in the cross track direction by an amount equal to one dot row and overwrites the next data row. Thus, no problem occurs even though data are written to dot rows other than the desired one.

After the write operation to the first dot row D1, the actuator 13 performs tracking control so as to move the write head 12W in the cross track direction by an amount equal to one dot row such that the edge of the write head 12W in the cross track direction covers the second dot row D2, as illustrated in FIG. 2B. At this time, a write phase is shifted by a half dot pitch, i.e., a phase angle of 180°, in accordance with the dot row. In this manner, 010110 ... are written to the second dot row D2, the third dot row D3, and the fourth dot row D4. Thus, the unintended data written to the second dot row D2 during the write operation to the first dot row D1 illustrated in FIG. 2A is overwritten with the intended write data.

After the write operation to the second dot row D2, the actuator 13 performs tracking control so as to move the write head 12W in the cross track direction by an amount equal to one dot row such that the edge of the write head 12W in the cross track direction covers the third dot row D3, as illustrated in FIG. 2C. In this manner, 0110010 ... are written to the third dot row D3, the fourth dot row D4, and the fifth dot row D5. Thus, the unintended data written to the third dot row D3 during the write operation to the second dot row D2 illustrated in FIG. 2B is overwritten with the intended write data.

Thereafter, data are similarly written to one dot row at a time by performing the shingled recording, in which after carrying out a write operation, the write head 12W is moved in the cross track direction by an amount equal to one dot row and overwrites the previously written data with the intended data. At this time, on all dot rows, recording is carried out at a write frequency corresponding to a dot pitch (dp), thus preventing a decrease in write phase margin. This allows relief of the requirements for the accuracy with which the magnetic dots in the bit patterned medium 10 are arrayed and the accuracy of width of the write head 12W.

Now, a readout method from the bit patterned medium illustrated in FIG. 2 will be described with reference to FIG. 3. As illustrated in FIG. 3, the read head 12R has a width covering a plurality of dot rows, for example, two dot rows. During a read operation, the read head 12R is subjected to tracking control such that the center of the read head 12R in the width direction thereof is positioned at the center between two dot rows. Since the two dot rows are out of phase with each other by 180 degrees, the read head 12R, the width of which covers two dot rows, can alternately read data from the two dot rows. If 00010011... are recorded in the first dot row and 11010011... are recorded in the second dot row, readout data are 0101001100001111.

Figure 4B:
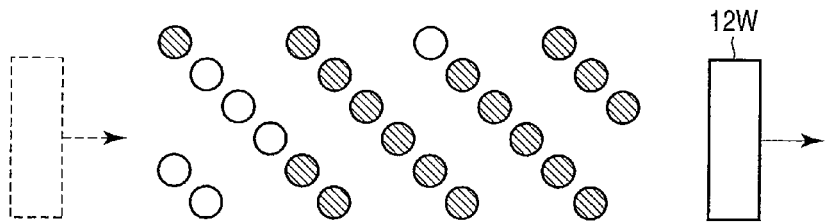
Figure 4C:
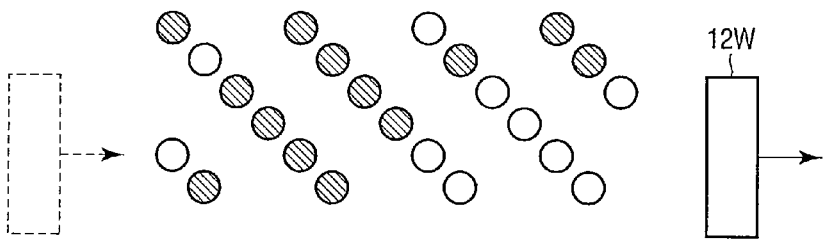

FIGS. 4A, 4B and 4C illustrate another example of a bit patterned medium. With reference to FIGS. 4A, 4B and 4C, shingled recording carried out on the bit patterned medium will be described below. In the bit patterned medium illustrated in FIGS. 4A to 4C, two adjacent dot rows are out of phases with each other by 90 degrees. That is, between two adjacent dots in the first dot row, corresponding single dots in the second, third, and fourth rows, respectively, are inserted.

The write head 12W has a width covering more than four dot rows, for example, five dot rows.

FIG. 4A illustrates a write operation to the first dot row D1. During the write operation to the first dot row D1, the actuator 13 performs tracking control such that the edge of the write head 12W in the cross track direction covers the first dot row D1. Then, 1101... are written to the first dot row. At this time, since the write head 12W has a width covering five dot rows, the same data are written to each of the first dot row to the fifth dot row D5.

After the write operation to the first dot row D1, the actuator 13 performs tracking control so as to move the write head 12W in the cross track direction by an amount equal to one dot row such that the edge of the write head 12W in the cross track direction covers the second dot row D2, as shown in FIG. 4B. Then, 0111... are written to each of the second dot row D2 to the sixth dot row D6.

After the write operation to the second dot row D2, the actuator 13 performs tracking control so as to move the write head 12W in the cross track direction by an amount equal to one dot row such that the edge of the write head 12W in the cross track direction covers the third dot row D3, as shown in FIG. 4C. Then, 1100... are written to each of the third dot row D3 to the seventh dot row D7.

Thereafter, data are similarly written to one dot row at a time by performing the shingled recording, in which after carrying out the write operation, the write head 12W is moved in the cross track direction by an amount equal to one dot row and overwrites the previously written data with the intended data.

The dot pitch (dp) in FIG. 4 is double that in FIG. 2. This serves to increase the write phase margin.

Figure 5:
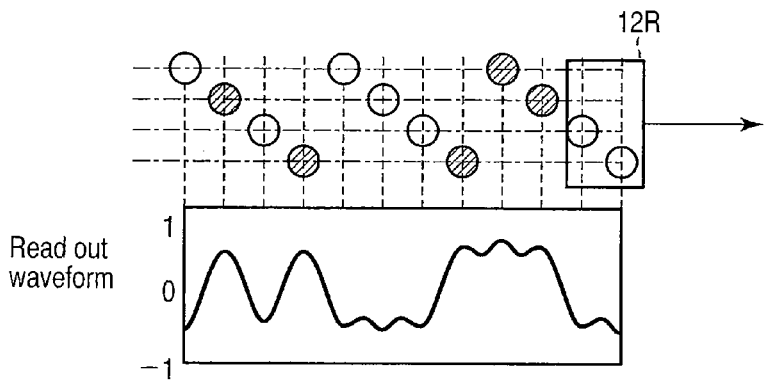
FIG. 5 is a diagram illustrating a readout method from the medium illustrated in FIG. 4.

Now, a readout method from the bit patterned medium illustrated in FIG. 4 will be described with reference to FIG. 5. As illustrated in FIG. 5, the read head 12R has a width covering a plurality of dot rows, for example, four dot rows. The read head 12R is subjected to tracking control such that the widthwise center of the read head 12R is positioned at the center between the second dot row and the third dot row. Since adjacent dot rows in the four dot rows are out of phase with each other by 90 degrees, the read head 12R can sequentially read data from the four dot rows. If 001... are recorded in the first dot row, 101... are recorded in the second dot row, 000... are recorded in the third dot row, and 110... are recorded in the fourth dot row, readout data are 010100011100.

The phase shift between two adjacent dot rows may be less than 180 degrees. If between two adjacent dots in the first row corresponding single dots in the second and third rows are inserted, for example, the phase shift is 120 degrees. Alternatively, if between two adjacent dots in the first row corresponding single dots in the second, third, fourth, and fifth rows are inserted, the phase shift is 72 degrees.

EXAMPLE 1

In the present example, an example will be described in which data subjected to error correcting coding is recorded, in a divided manner, in a plurality of tracks covered by the read head during a read operation. Here, the data subjected to error correcting coding are (1, 2, 3, 4, ...).

FIG. 6 illustrates an example in which the read head has a width covering two dot rows and in which data subjected to error correcting coding are recorded in two dot rows in a divided manner. One dot row corresponds to one track. In FIG. 6, the data are recorded in such a divided manner that data (1, 3, ...) are recorded in the dot row D1, while data (2, 4, ...) are recorded in the dot row D2.

FIG. 7 illustrates an example in which the read head has a width covering five dot rows and in which data subjected to error correcting coding are recorded in five dot rows in a divided manner. In FIG. 7, the data are recorded in the following divided manner: data (1, 6, ...) are recorded in the dot row D1, data (2, 7, ...) are recorded in the dot row D2, data (3, 8, ...) are recorded in the dot row D3, data (4, 9, ...) are recorded in the dot row D4, and data (5, 10, ...) are recorded in the dot row D5.

FIG. 8 is another example in which the read head has a width covering five dot rows and in which data subjected to error correcting coding are recorded in five dot rows in a divided manner. In FIG. 8, data are recorded in the following divided manner: data (1, 6, ...) are recorded in the dot row D1, data (3, 8, ...) are recorded in the dot row D2, data (5, 10, ...) are recorded in the dot row D3, data (2, 7, ...) are recorded in the dot row D4, and data (4, 9, ...) are recorded in the dot row D5. That is, the magnetic dots in the five dot rows are arrayed so that the read head can read data from the dots in a zigzag manner.

During a read operation, in any of FIG. 6 to FIG. 8, data are read in the order of (1, 2, 3, 4, ...).

Figure 9:
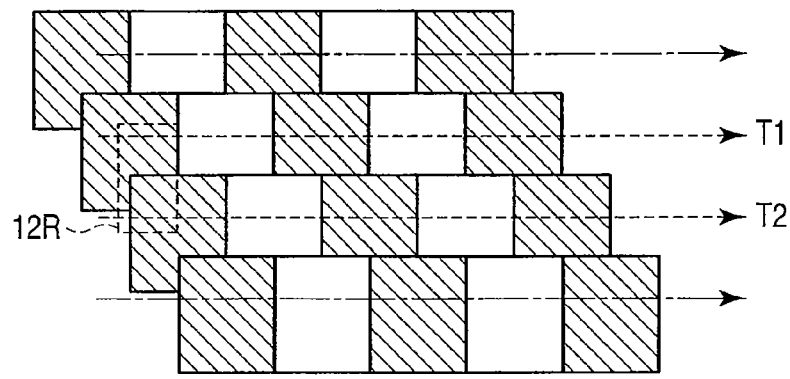
FIG. 9 is a diagram illustrating an example in which data subjected to error correcting coding is recorded in two tracks in a divided manner according to Example 1.

The present example is applicable to shingled recording carried out on a continuous film medium. FIG. 9 illustrates an example in which the read head has a width covering two tracks and in which data subjected to error correcting coding are recorded in two tracks T1 and T2 in a divided manner.

Figure 10A:
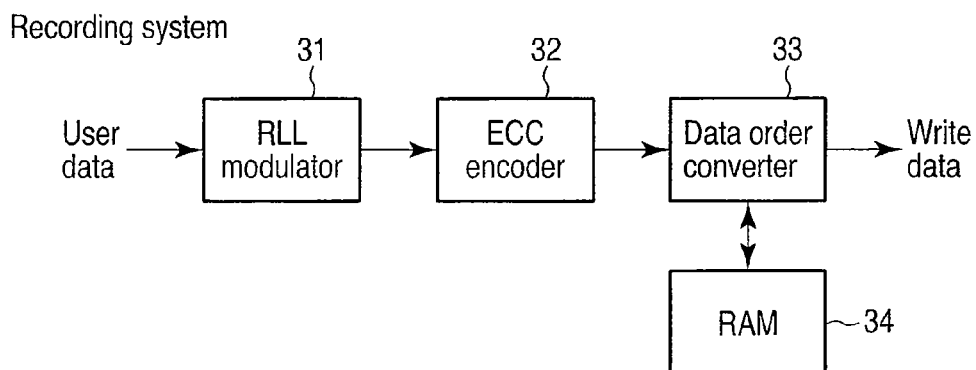
FIGS. 10A and 10B are block diagrams of a data processing system according to Example 1.
Figure 10B:
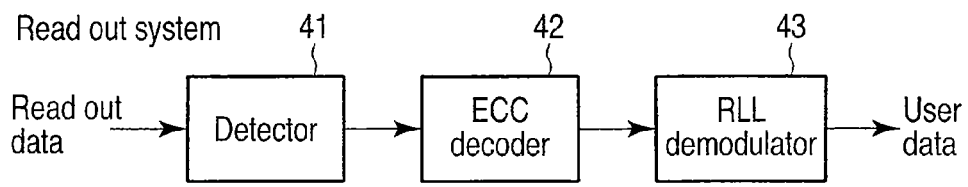

FIGS. 10A and 10B are block diagrams of a data processing system according to the present example. FIG. 10A is a block diagram of a recording system. User data are modulated by an RLL modulator 31, and the modulated user data are subjected to error correcting coding by an ECC encoder 32. Then, the order of the resultant data are converted by a data order converter 33 such that the data are recorded in a plurality of tracks, based on information stored in RAM 34. Thus, write data are generated. FIG. 10B is a block diagram illustrating a readout system. Readout data are detected by a detector 41 and decoded by an ECC decoder 42. The decoded data are then demodulated into user data by an RLL demodulator 43.

Figure 11A:
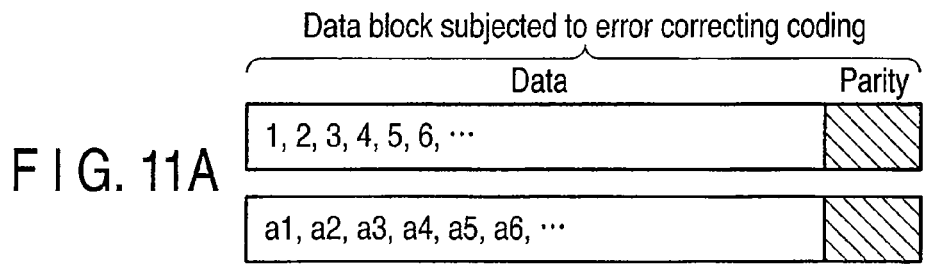
FIGS. 11A and 11B are diagrams showing data formats according to Example 1.
Figure 11B:
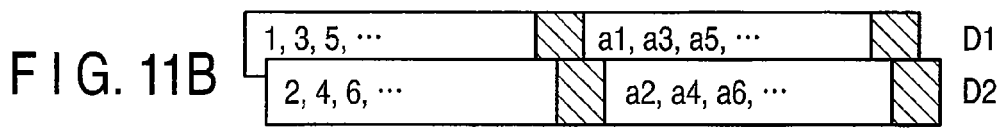

FIG. 11A illustrates the data format formed of data and parities subjected to error correcting coding by the ECC encoder 32. FIG. 11B illustrates the format of write data the order of which has been converted by the data order converter 33. These examples correspond to the data formats obtained when the read head has a width covering two tracks and when data subjected to error correcting coding and parities for the data are recorded in two tracks in a divided manner.

In the present example, when the read head has a width covering two tracks, the data detected during a read operation and the parities for the data can be subjected to data processing in order of the readout. Thus, the transfer rate during the read operation can be made twice as high as that during recording. Moreover, when the read head has a width covering five tracks, the transfer rate during a read operation can be made five times as high as that during recording. Hence, the present example allows the transfer rate during a read operation to be improved.

EXAMPLE 2

Figure 12:
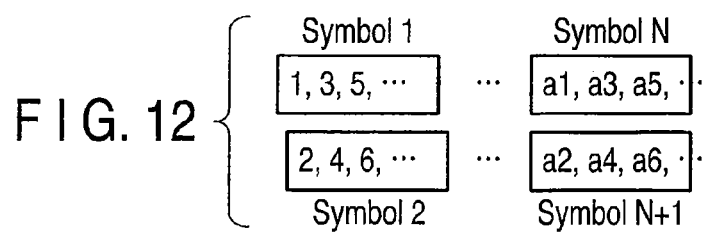
FIG. 12 is a diagram showing the configuration of symbols on one track according to Example 2.

FIG. 12 illustrates a preferred configuration of symbols that are basic units for error correcting coding on each dot row or track illustrated in FIG. 11B. As illustrated in FIG. 12, data (1, 3, 5, ..., a1, a3, a5, ...) recorded on one dot row (track) and data (2, 4, 6, ..., a2, a4, a6, ...) recorded on the next dot row are configured such that data in symbol 1 are located adjacent to data in symbol 2, ..., and data in symbol N are located adjacent to data in symbol N+1.

In the shingled recording, data are recorded in dot rows such that the dot rows are displaced from one another. Thus, since data are recorded in a dot row succeeding a dot row with data already recorded therein, an error may occur during a read operation of the already recorded data. This error occurs consecutively in the dot rows. In the configuration according to Example 2 in which recording target dots in symbol 1 are located adjacent to recording target dots in symbol 2, and recording target dots in symbol N are located adjacent to recording target dots in symbol N+1, if errors occur consecutively, the errors concentrate in the same symbol. This enables efficient error correction.

EXAMPLE 3

Figure 13A:
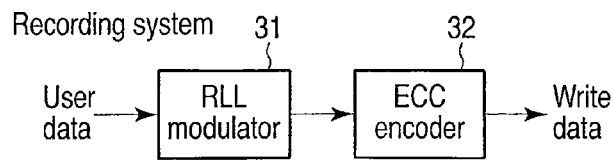
FIGS. 13A and 13B are block diagrams of a data processing system according to Example 3.
Figure 13B:
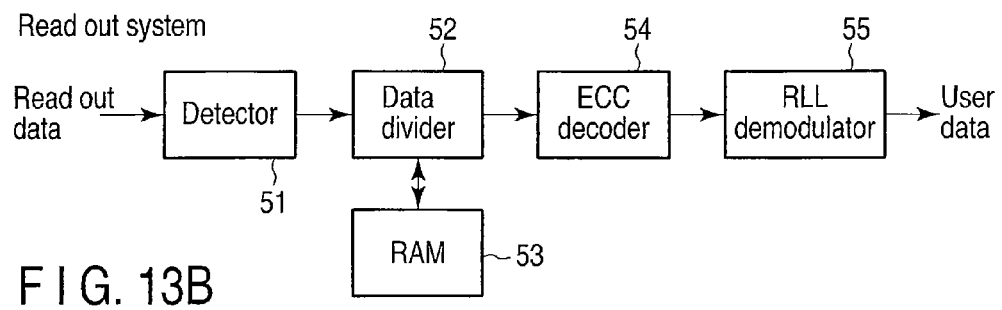
Figure 14:
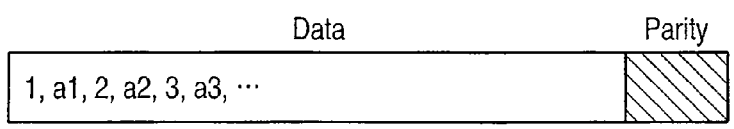
FIG. 14 is a diagram showing a data format according to Example 3.

FIGS. 13A and 13B are block diagrams of a data processing system according to the present example. FIG. 13A is a block diagram of a recording system. User data are modulated by an RLL modulator 31, and the modulated user data are subjected to error correcting coding by an ECC encoder 32. Thus, write data are generated. The format of the generated write data are as shown in FIG. 11A. An ECC data block is written to the first dot row or the track. The next ECC data block is written to the second dot row or the track. FIG. 13B is a block diagram of a readout system. Data from two dot rows or tracks are detected by a detector 51. In the readout data, data from the two dot rows or the tracks, that is, data in two different ECC blocks are alternately arrayed (see FIG. 14). Then, a data divider 52 divides the data alternately detected in the two dot rows or the tracks in accordance with two data blocks subjected to error correcting coding, based on information stored in RAM 53. An ECC decoder 54 then decodes the data resulting from the division, and an RLL demodulator 55 demodulates the decoded data into user data. As described above, the present example enables data processing by sequentially reading a plurality of dot rows or tracks subjected to shingled recording.

EXAMPLE 4

As described above, in the shingled recording, since data are recorded in a dot row succeeding a dot row with data already recorded therein, an error may occur during a read operation of the already recorded data. This means that an error is more likely to occur in a preceding data row or a track with data recorded therein earlier, whereas an error is more unlikely to occur in a succeeding data row or a track with data recorded therein later. Normally, the number of parities added to one data row or one track is determined in accordance with a state in which an error is most likely to occur.

Figure 15:
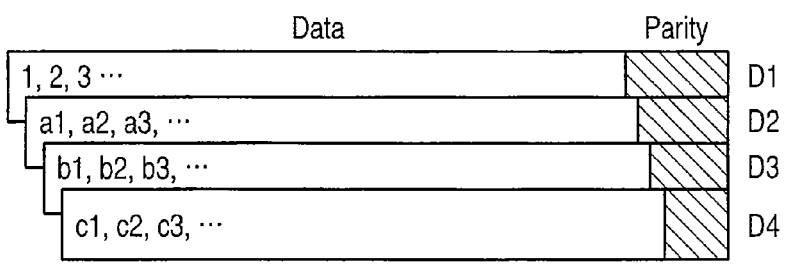
FIG. 15 is a diagram showing a data format according to Example 4.

However, since it is known that an error is more likely to occur in a preceding data row or a track, whereas an error is more unlikely to occur in a succeeding data row or a track, the number of parities added to data may be reduced in a direction from the data row or the track D1 with data recorded therein earlier toward the data row or the track D4 with data recorded therein later, as illustrated in FIG. 15. Thus, the present example serves to improve the efficiency of addition of ECC parities and thus the efficiency of formatting.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic recording apparatus configured to record data subjected to error correcting coding according to a shingled recording scheme, the magnetic recording apparatus comprising:
    a magnetic recording medium in which unit bits of the data subjected to error correcting coding are recorded with a phase shift between adjacent tracks;
    a read head having a width that is large enough to cover a plurality of tracks and configured to read data from the plurality of tracks; and
    a recording controller configured to record data in the plurality of tracks covered by the read head, in a divided manner, wherein the bits of the data subjected to error correcting coding are configured to form symbols that are basic units for the error correcting coding, and the bits are configured to be arranged adjacent to one another on one track.

2. The magnetic recording apparatus of claim 1, wherein the magnetic recording medium is a bit patterned medium comprising a plurality of magnetic dot rows with a phase shift between adjacent dot rows.

3. The magnetic recording apparatus of claim 1, wherein the magnetic recording medium is a continuous film medium.

4. A magnetic recording apparatus configured to record data subjected to error correcting coding according to a shingled recording scheme, the magnetic recording apparatus comprising:
- a magnetic recording medium in which unit bits of the data subjected to error correcting coding are recorded with a phase shift between adjacent tracks;
- a read head having a width that is large enough to cover a plurality of tracks and configured to read data from the plurality of tracks; and
- a recording controller configured to carry out recording in such a manner that, with respect to parities for the data subjected to error correcting coding, the parities added to data in one track are smaller in number than parities added to data in a succeeding track.

5. The magnetic recording apparatus of claim 4, wherein the magnetic recording medium is a bit patterned medium comprising a plurality of magnetic dot rows with a phase shift between adjacent dot rows.

6. The magnetic recording apparatus of claim 4, wherein the magnetic recording medium is a continuous film medium.

* * * * *